Figure 1:
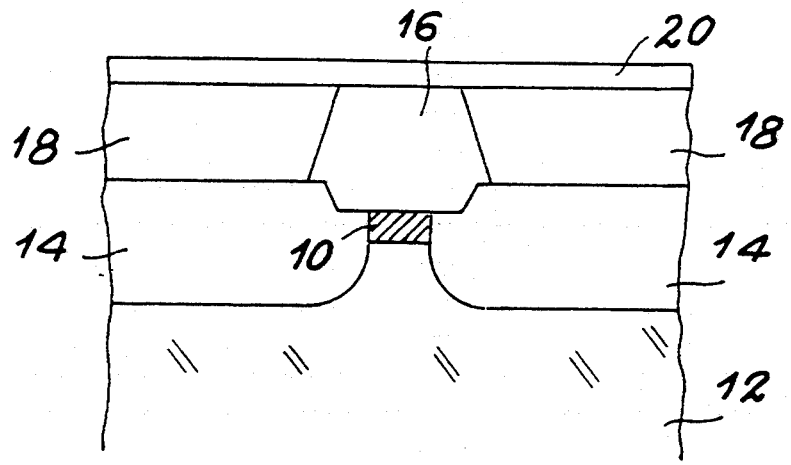

United States Patent [19]
Kazmierski et al.

[11] Patent Number: 5,440,147
[45] Date of Patent: Aug. 8, 1995

[54] OPTOELECTRIC DEVICE HAVING A VERY LOW STRAY CAPACITANCE AND ITS PRODUCTION PROCESS

[75] Inventors: Christophe Kazmierski, Morangis; Didier Robein, Fontenay aux Roses, both of France

[73] Assignee: France Telecom

[21] Appl. No.: 122,610

[22] PCT Filed: Apr. 15, 1992

[86] PCT No.: PCT/FR92/00338

§ 371 Date: Sep. 29, 1993

§ 102(e) Date: Sep. 29, 1993

[87] PCT Pub. No.: WO92/19029

PCT Pub. Date: Oct. 29, 1992

[30] Foreign Application Priority Data

Apr. 16, 1991 [FR] France ............................ 91 04636

[51] Int. Cl.⁶ .............................................. H01L 33/00
[52] U.S. Cl. ........................................ 257/13; 257/95; 257/96; 257/97; 437/127; 437/129; 437/905; 372/45; 372/46; 372/48
[58] Field of Search ................... 257/13, 98, 95, 96, 257/97; 372/45, 46, 48; 437/905, 127, 129

[56] References Cited

U.S. PATENT DOCUMENTS

4,977,568 12/1990 Yamamoto et al. ............. 372/48 X

FOREIGN PATENT DOCUMENTS

| 59-112674 | 6/1984 | Japan | 372/48 |
| 59-124183 | 7/1984 | Japan | 372/48 |
| 59-175783 | 10/1984 | Japan | 372/48 |
| 3054883 | 3/1991 | Japan | |

OTHER PUBLICATIONS

Sasaki et al., "A2.5-MA Threshold Current Operation and a 5-GBit/S Zero-Bias Current Modulation of 1.5 μm MQW-DFB Laser Diodes,".
Optical Fiber Communication Conference 1990, Technical Digest Series, vol. 1, 22 Jan. 1990, San Francisco, Calif., USA, p. 213.
Ishiguro et al., "Very Low Threshold Planar Buried Heterostructure InGaAsP/InP Laser Diodes Prepared by Three-Stage Metalorganic Chemical Vapor Deposition," Appl. Phys. Lett., vol. 51, No. 12, 21 Sep. 1987, pp. 874–876.
Miller et al., "Tertiarybutylarsine as a Substitute for AsH$_3$: Application to InGaAs/InP Photonic Integrated Circuits," Second International Conference-Indium Phosphide and Related Materials, 23 Apr. 1990, Denver, Colo., USA, pp. 161–164.
Bowers et al., "High-Speed, Polyimide-Based Semi--Insulating Planar Buried Heterostructures," Electronics Letters, vol. 23, No. 24, 19 Nov. 1987, pp. 1263–1265.
Razeghi et al., "CW Operation of 1.57-μm Ga$_x$In$_{1-x}$As$_y$P$_{1-y}$InP Distributed Feedback Lasers Grown by Low-Pressure Metalorganic Chemical Vapor Deposition," Appl. Phys. Lett. 45(7), 1 Oct. 1984, pp. 784–786.
Pat. Abst. of Japan, vol. 15, No. 200 (E-1070) Jun. 22, 1991.

*Primary Examiner*—William Mintel
*Attorney, Agent, or Firm*—Cesari and McKenna

[57] ABSTRACT

An optoelectronic device having a very low stray capacitance and its production process. This optoelectronic device comprises an n-doped semiconductor substrate layer, (46); on said substrate layer a lateral confinement layer (50) of semiconductor material doped so as to be semi-insulating; a stripe (30) incorporating an active material (32), said stripe being buried in the lateral confinement layer and in contact with the substrate layer, the lateral confinement layer having a groove (52) hollowed out above and along the stripe; an n-doped semiconductor blocking layer (70) deposited on each side of the groove on the lateral confinement layer; a p-doped vertical semiconductor layer (60) deposited on the blocking layer and filling the groove, the blocking layer being made from a material having a different composition from that of the lateral and vertical confinement layers; a first electrical contact (80, 90) on the vertical confinement layer at least vertically of the stripe (30) and a second electrical contact (44) on the substrate layer.

9 Claims, 2 Drawing Sheets

OPTOELECTRIC DEVICE HAVING A VERY LOW STRAY CAPACITANCE AND ITS PRODUCTION PROCESS

This application is a Rule 371 continuation of PCT/FR92/00338, filed Apr. 15, 1992.

DESCRIPTION

The present invention relates to an optoelectronic device having a very low stray capacitance and its production process. It more particularly applies to the production of semiconductor lasers, optical modulators or amplifiers having an electrically controlled and very high switching speed.

The buried ridge stripe or BRS structure is described in the article by J. C. Bouley et al, published in Proceedings of the 9th IEEE International Laser Conference, p. 54, 1984 and which makes it possible to produce optoelectronic devices having a high switching speed and in particular semiconductor lasers.

A semiconductor laser produced according to the BRS method has a stripe including an active layer with a small gap buried in a wider gap confinement layer. The confinement is then electrical and optical. The stripe guides the light beam produced during electrical excitation. The optical cavity necessary for obtaining the laser effect is constituted by the cleaved or etched ends of the strip.

The optoelectronic devices produced according to the BRS method respond very rapidly to electrical excitations. The ultimate response time limited by the relaxation process of the carriers in the conduction and valence bands. It can therefore theoretically reach durations of approximately 1 picosecond. However, such an operating speed is more severely limited by the actual structure of the component and its parasitic electrical elements. Generally, the parasitic circuit is equivalent to an RC circuit, in which R is the access resistance to the active zone and C a stray capacitance.

FIG. 1 diagrammatically shows a known laser structure described in the article by J. E. Bowers al, published in ELectronics Letters, vol.23, no.24, pp.1263-1265, 19.11.1987. This device is derived from a BRS structure and has an improved response time.

A stripe 10 including an active material layer rests on an n-doped InP substrate 12. The two lateral sides of the stripe 10 are surrounded by a semi-insulating, InP, lateral confinement layer 14. A p-doped, InP, vertical confinement layer 16 is positioned vertically of the stripe 10 in a groove corresponding to the impression of the dielectric growth stopping mask used during the selective epitaxy stage for forming the layer 14. The vertical confinement layer 16 is truncated and its lateral faces are surrounded by a polyimide dielectric layer 18. The profile of the layer 16 is obtained by epitaxy on the complete structure and then etching, in accordance with a desired pattern, of the said layer 16. The upper face is covered with a contact layer 20.

The short response time (RC approximately 4 ps) of such a structure is obtained as a result of the limited contact surface between the vertical confinement layer 16 and the semi-insulating layer 14. Thus, said contact zone when large is a current loss source due to the diffusion of acceptors of the vertical confinement layer 16 into the semi-insulating layer 14, which then loses its dielectric properties.

However, this structure still suffers from a certain number of disadvantages. Thus, its construction makes use of a selective epitaxy stage for the formation of the semi-insulating, lateral confinement layer 14. The presence of a growth stopping mask of a different nature from that of the semi-insulating layer (whereof only the groove-like impression is visible in FIG. 1) is a source of disturbances (mechanical stresses) and defects in the semi-insulating material, more particularly on the mask border and therefore in direct proximity to the active layer. These disturbances and defects are responsible for current losses, thus increasing the stray capacitance of the component and in certain cases the threshold current.

Moreover, during the epitaxy stage of the vertical confinement layer 16, the diffusions of zinc (p-dopant of the layer 16) towards the semi-insulating layer 14 and conversely iron (dopant of the layer 14) towards the vertical confinement layer are possible leading to current losses and, therefore, a further increase in the stray capacitance.

Moreover, the truncated vertical confinement layer 16, due to its limited width and polyimide surroundings, does not have good thermal properties. This limited width also increases the access resistance of the component, which leads to a rise in the response time of the structure.

It is also known from Optical Fiber Communication Conference 1990 Technical Digest Series, vol.1, January 1990 by T. Sasaki et al, p.213 to have a laser structure with an n-doped InP, blocking layer between the InP, semi-insulating, lateral confinement layer doped with iron ions and a p-type InP layer.

The n-doped, InP blocking layer, of the same composition as the p-type and semi-insulating layers, induces a supplementary distributed capacitance due to the homojunction of said layer and the p-layer. Moreover, said structure is produced in three epitaxy stages, whereof one is unfortunately selective, for the successive deposition of the semi-insulating layer and the blocking layer, thus increasing the stray capacitance of the structure. The presence of a high stray capacitance slows down the high frequency operation of the device.

The present invention relates to an optoelectronic device having a very low stray capacitance and its production process, which makes it possible to obviate these disadvantages. It recommends a structure in which the active zone is surrounded by a large volume of semiconductor and semi-insulating material (for the good thermal behavior of the device), without making use of a selective epitaxy (producing defects) and making it possible to block the interdiffusion of acceptors of the vertical confinement layer towards the semi-insulating layer and of dopant from the semi-insulating layer towards the vertical confinement layer.

For this purpose, an insulating layer made from a different material from the semi-insulating layer and the vertical confinement layer is deposited on the semi-insulating layer, thus making it possible to extend the deposit of the vertical confinement layer without any interdiffusion risk.

More specifically, the present invention relates to an optoelectronic device comprising:
an n-doped, semiconductor material substrate layer;
on said substrate layer, a lateral confinement layer of a semiconductor material doped so as to make it semi-insulating;

a stripe including an active material, said stripe being buried in the lateral confinement layer and in contact with the substrate layer, the lateral confinement layer having a groove hollowed out above and along the stripe;

an n-doped, semiconductor material blocking layer deposited on either side of the groove on the lateral confinement layer;

an p-doped, semiconductor material, vertical confinement layer deposited on the blocking layer and filling the groove of the lateral confinement layer, the blocking layer being made from a material having a different composition from that of the lateral confinement layer and that of the vertical confinement layer;

a first electrical contact on the vertical confinement layer at least vertically of the stripe; and a second electrical contact on the substrate layer.

The blocking layer according to the invention makes it possible to maintain the semi-insulating character of the lateral confinement layer, thus reducing the stray capacitance of the device. In particular, this capacitance is four times weaker than that of the device of T. Sasaki referred to hereinafter. Thus, the device according to the invention has a four times faster operating potentiality than that of T. Sasaki, particularly under high frequency.

Advantageously, the vertical confinement layer is V-shaped vertically of the stripe including the active material, the first electrical contact adopting said shape. The V-shape makes it possible to increase the metallization surface of the contact and therefore decrease the contact resistance. It also makes it possible to reduce the access resistance to the active zone and, therefore, participates in the improvement of the response time of the device.

According to a special embodiment, the substrate layer, the lateral confinement layer and the vertical confinement layer are made from a first semiconductor material chosen from within category III-V, the stripe being constituted by components belonging to category III-V, the blocking layer being formed from a second semiconductor material having a different composition from that of the first material and chosen from within category III-V.

Advantageously, the blocking layer is of a quaternary semiconductor material, which makes it possible to produce a very thin insulating layer.

In particular, the substrate layer, the lateral confinement layer and the vertical confinement layer are of InP, the active material of the stripe of GaInAsP, GaInAs or GaAlAs and the insulating layer is of GaInAsP.

GaInAsP is understood to mean a material made from $Ga_xIn_{1-x}As_yP_{1-y}$ with $0<x<1$ and $0<y<1$ and in particular of GaAs. GaAlAs means a $Ga_xAl_{1-x}As$ material with $0<x<1$. GaInAs means a $Ga_xIn_{1-x}As$ material with $0<x<1$ and so on, $x=y=0$ is excluded.

The substrate layer can consist of an n-doped, solid, semiconductor material or an n-doped, semiconductor layer, epitaxied on a semiconductor support material, which can be semi-insulating or n or p-doped.

When using a p-type or semi-insulating support material, it must be etched up to the n-type semiconductor layer in order to expose part of said layer, The electrical contact is then formed on said exposed part.

The present invention also relates to a process for the production of an optoelectronic device comprising the following stages:

a) producing a stripe on an n-doped, semiconductor substrate layer, including at least one active material layer and an upper etching stopping layer, b) deposition of a lateral confinement layer of a semiconductor material doped in such a way as to make said material semi-insulating on the substrate layer and covering the stripe, c) producing on the lateral confinement layer an etching mask made from an n-doped semiconductor material having a composition different from that of the lateral confinement layer, which constitutes an blocking layer and has an opening vertically of the stripe, d) etching a groove in the lateral confinement layer vertically of the stripe using the etching mask, the depth of the groove being limited by the etching stopping layer, e) deposition of a vertical confinement layer, on the blocking layer, made from an p-doped semiconductor material and having a composition different from that of the insulating layer, said vertical confinement layer filling the groove and f) producing first and second electrical contacts, respectively, on the vertical confinement layer and the substrate layer.

Advantageously, the etching stopping layer is eliminated between stages d) and e).

Advantageously, the vertical confinement layer is deposited by vapor phase epitaxy.

The invention is described in greater detail hereinafter relative to non-limitative embodiments and with reference to the attached drawings, wherein show:

FIG. 1 Already described, diagrammatically a prior art optoelectronic device.

Figure 2:
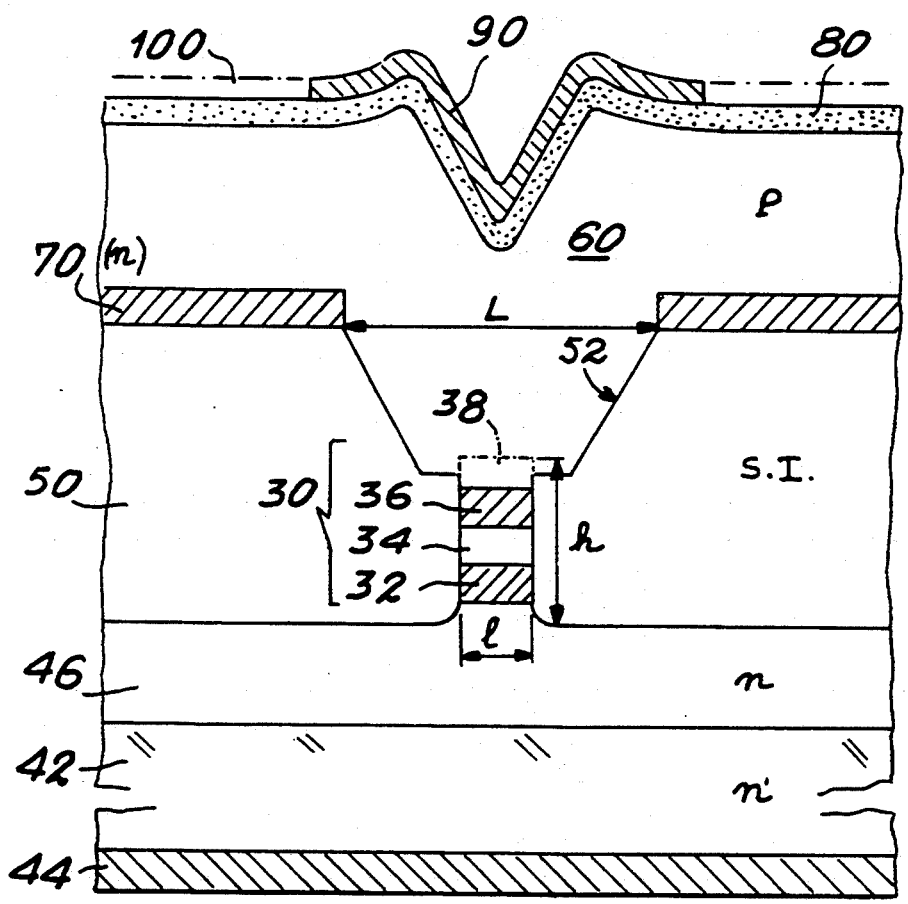

FIG. 2 Diagrammatically and in section, an optoelectronic device according to the invention.

FIGS. 3a to 3e Diagrammatically, different stages in the process for the production of a device according to the invention.

With reference to FIG. 2, a description will now be given of an optoelectronic device according to the invention. In this embodiment, the semiconductor materials are chosen in category III-V, without this representing the scope of application of the invention.

As can be seen in FIG. 2, an active stripe 30 including an active material rests on a monocrystalline substrate 42, e.g. of n-doped InP. The n-dopant can be of silicon, sulphur or tin and its concentration is in a range from $5 \times 10^{17}$ to $3 \times 10^{18}$ atm/cm$^3$ and is e.g. $1 \times 10^{18}$ atm/cm$^3$.

The lower surface of the type n-substrate 42 is metallized in order to form an electrode 44, e.g. of TiAu.

In the embodiment shown, the upper face of the substrate 42 is provided with a buffer layer 46 (referred to as the substrate layer) and this is also of InP n-doped e.g. with silicon at a concentration of $1 \times 10^{18}$ atm/cm$^3$.

In the embodiment shown, the active stripe 30 has three layers 32, 34, 36.

The first layer 32 is of active material. It can be produced from solid $Ga_xIn_{1-x}As_yP_y$ with $0<x<1$ and $0<y<1$ and e.g. of $Ga_{0.24}In_{0.76}As_{0.52}P_{0.48}$ for laser emission at 1.3 μm or $Ga_{0.39}In_{0.61}As_{0.87}P_{0.13}$ for laser emission at 1.55 μm, or $Ga_xIn_{1-x}As$ with $0<x<1$, or GaAs or $Ga_xAl_{1-x}As$ with $0<x<1$.

The layer 32 can also be constituted by a stack of alternate GaInAs and GaInAsP layers, so as to form a quantum well structure or a superlattice and has a GaInAsP optical guide with a constant or gradual composition, but which differs from the composition of the quantum well material. In this way the device can operate in a wavelength range from 1200 to 600 nm. For example, for operating at 1550 nm, the respective compositions can be $Ga_{0.47}In_{0.53}As$ and $Ga_{0.24}In_{0.76}As_{0.52}P_{0.48}$.

The second layer 34 of the stripe is an active material layer protection layer with a thickness between 0.01 and 0.1 micrometer. It can be of p-type InP, e.g. doped with Zn at a concentration of $5 \times 10^{17}$ atm/cm$^3$. This protection layer prevents contact between the active layer and air, particularly during production or with another layer.

In the embodiment shown in FIG. 2, the stripe 30 has a third layer 36. This layer 36 is optional and produces a distributed feedback network. The layer 36 can be constituted by a stack of $Ga_xIn_{1-x}As_yP_{1-y}$ layers (with x and y not zero simultaneously) and InP in exemplified manner: $Ga_{0.24}In_{0.76}As_{0.52}P_{0.48}$ and InP. The network is e.g. etched chemically, dry etched or using any other known procedure.

In the case where the device comprises such a layer 36, the protection layer makes it possible to control the distance separating the layer 36 and the active layer 32.

The stripe 30 optionally comprises a supplementary etching stopping layer 38, whose function and composition will be described hereinafter. The stripe 30 has a width l of 1 to 3 μm, e.g. 2 μm. Its height h is e.g. between 0.2 and 0.6 μm.

The stripe 30 is buried in a lateral confinement layer 50 of a semiconductor material doped so as to be semi-insulating. The material can be InP e.g. doped with iron in a concentration between $1 \times 10^{16}$ atm/cm$^3$ to $5 \times 10^{17}$ atm/cm$^3$. The concentration can e.g. be $1 \times 10^{17}$ atm/cm$^3$.

The lateral confinement layer 50 comprises a groove 52 made above and along the stripe 30. This groove makes it possible to reduce the contact surface between the lateral confinement layer and a vertical confinement layer described hereinafter.

The shape of the groove results from the etching type used, namely rectangular, trapezoidal, cylindrical or a combination of these shapes. The upper opening L of the groove 52 has a width between 1 and 5 μm, e.g. approximately 2 μm.

The total height of the lateral confinement layer exceeds 1 μm and is e.g. 2 μm. It results from a compromise between the need for an adequate height for reducing the stray capacitance of the optoelectronic device, the obtaining of a good insulation and a small contact surface at the groove 52. It is also clear that the greater the height of the stripe the smaller the contact surface at the groove 52.

The lateral confinement layer 50 is covered by a vertical confinement layer 60, which fills the groove 52. This layer 60 is of an p-doped semiconductor material, e.g. InP doped with Zn in a concentration between $1 \times 10^{17}$ atm/cm$^3$ and $5 \times 10^{18}$ atm/cm$^3$, e.g. $2 \times 10^{18}$ atm/cm$^3$.

The extension over the entire width of the device of the vertical confinement layer 60 makes it possible to distribute the access resistance of the device and reduce it at the stripe 30. Moreover, said extension makes it possible to obtain a good thermal behavior on the part of the device.

In order to limit the interdiffusion of dopants between the lateral and vertical confinement layers 50, 60, a blocking layer 70 is placed on either side of he groove 52 at the interface between the confinement layer 50, 60. This layer 70 more particularly makes it possible to preserve the dielectric character of the semi-insulating layer and therefore contributes to reducing the stray capacitance.

This blocking layer is produced from an n-doped semiconductor material with a composition different from that of the material used for the confinement layers. Advantageously, use is made of a quaternary material, which allows a very limited layer thickness of approximately 0.1 μm.

The layer 70 can be of GaInAsP, $Ga_{0.24}In_{0.76}As_{0.52}P_{0.48}$ doped with silicon in a concentration which can range between $1 \times 10^{16}$ and $2 \times 10^{18}$ atm/cm$^3$ and is e.g. $1 \times 10^{18}$ atm/cm$^3$.

The vertical confinement layer 60 is V-shaped vertically of the stripe 30 including the active material.

An electrical contact layer 80, e.g. of $Ga_{0.47}In_{0.53}As$ covers the upper surface of the vertical confinement layer 60. This contact layer p$^+$-doped with Zn in a concentration between $5 \times 10^{18}$ and $2 \times 10^{19}$ atm/cm$^3$ and e.g. $1 \times 10^{19}$ atm/cm$^3$. An electrical contact is produced by an electrode 90 positioned level with the V. The electrode 90 can, e.g., be of TiPt.

The V-shape of the electrical contact makes it possible to reduce the access resistance to the active layer, while decreasing the contact resistance as a result of the increase of the metallized useful surface.

Optionally, the device comprises a dielectric layer 100 of $Si_3N_4$ or $SiO_2$ deposited on either side of the electrode 90. This layer 100 ensures an electrical insulation around the electrode.

With reference to FIGS. 3a to 3e, a description will now be given of the process for producing the optoelectronic device according to the invention.

Firstly (FIG. 3a) and e.g. using a metal organic vapor phase epitaxy (MOVPE), a monocrystalline substrate layer 46 is produced and which is covered by an active material layer 32. The substrate layer 46 is, as stated hereinbefore, constituted by n-doped InP. The active material layer is covered by MOVPE of a p-type, InP protection layer 34 and then an upper etching protection layer 38. The stopping layer has a thickness between 0.01 and 0.5 μm and e.g. 0.2 μm and can be of $Ga_{0.24}In_{0.76}As_{0.52}P_{0.48}$ p-doped with zinc in a concentration of $5 \times 10^{17}$ atm/cm$^3$.

These first two depositions can also be carried out by different known epitaxy methods, e.g. liquid phase epitaxy (LPE) or molecular beam epitaxy (MBE), with their variants.

A supplementary layer supporting a distributed feedback network can optionally be interposed between the layer 34 and the upper layer 38. The production of such a network is known and is, e.g., described in the article by M. Razeghi et al, published in Applied Physics Letters, vol.45, 1984, p.784, so that a detailed description thereof will not be provided here.

Figure 3A:
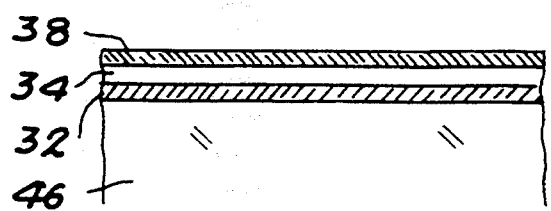
Figure 3B:
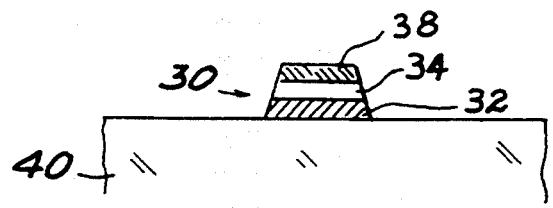
Figure 3C:
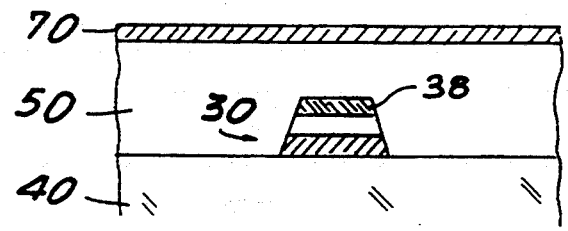

The layers 32, 34, 36 are then etched, e.g. in the crystal direction <110>. Etching can take place chemically using HBr:Br:H$_2$O or by reactive ion etching, or reactive ion beam etching (RE, RIBE) or combinations thereof. Said etching leads to the active stripe 30 (FIG. 3b).

On the complete structure is then deposited, e.g. during a second vapor phase epitaxy cycle, a lateral confinement semi-insulating layer 50 covered with a blocking layer 70 (FIG. 3) having a different composition from that of the layer 50 and which can be selectively etched with respect to said layer 50.

A second etching is then carried out. Firstly, an opening 72 facing the stripe 30 (with a width between 1 and 5 μm) is made selectively by photolithography in the blocking layer 70 by means of an etching solution not acting on the semi-insulating layer 50. In the case of a GaInAsP blocking layer and an InP semi-insulating layer, the etching solution can be $H_2SO_4:H_2O_2:H_2O$ (10:1:1).

Then, selective etching takes place of the semi-insulating layer 50, the blocking layer 70 then serving as an etching mask. This etching, e.g., takes place with the aid of a solution of $HCl:H_3PO_4$ (2:1) and is stopped by the etching stopping layer, which is in this case the chemical etching stopping layer.

Optionally, so as to avoid optical losses, the etching stopping layer 38 is selectively eliminated, e.g. with the aid of a solution of $H_2SO_4:H_2O_2:H_2O$. The protection layer 34 (or the layer supporting the network) then serves as an etching stopping layer, in this case the layer 38.

The second etching cycle described hereinbefore is chemical, but it is also possible to carry out ion and/or plasma etching. In this case, the etching stopping layers (layers 38 and 34 as a function of the type of etching produced) permit an etching depth control by analyzing the ionic or molecular species in the etching chamber. The thickness of said layers can then be extremely small, i.e. a few nanometers.

Figure 3D:
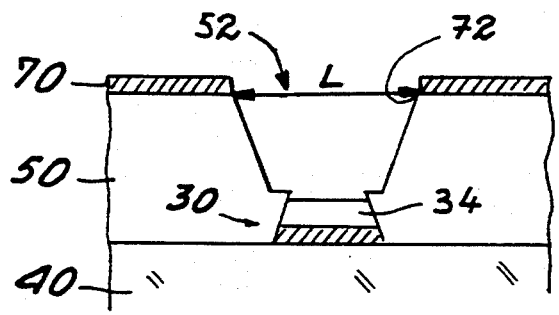

As can be seen in FIG. 3d, at the end of the second etching cycle, the lateral confinement layer 50 is provided with a groove 52 vertically of the stripe 30. It is also covered by the blocking layer 70, which has served as an etching mask and will then serve as the blocking layer.

By means of a vapor phase epitaxy cycle, a vertical confinement layer 60 is then deposited and covers the blocking layer 70 and fills the groove 52. The vertical confinement layer, which has a composition different from that of the blocking layer, is itself covered by an electric contact layer 80, deposited during the same vapor phase epitaxy cycle. The vapor phase epitaxy makes it possible to produce in the vertical confinement and contact layers 60, 80 a V-shape vertically of the stripe 30.

Figure 3E:
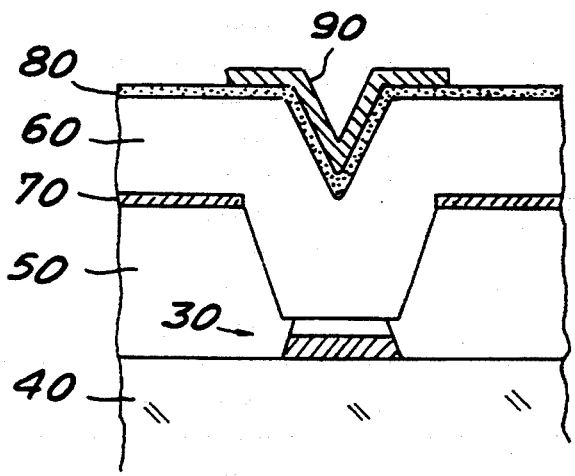

An electrode 90 is formed as a result of metallization (e.g. of TiPt) level with the V (FIG. 30 3e).

The device is completed when an electrode (e.g. of TiAu) is deposited on the lower face of the n-type substrate layer. As stated, it is also possible to ensure an electrical insulation of the upper surface of the device by means of a deposit of dielectric layer 100 (FIG. 2).

If it is wished to use the optoelectronic device according to the invention as a laser, it is necessary to polish or cleave the faces of the device parallel to the plane of FIG. 2.

The optoelectronic device according to the invention has a pass band which can exceed 18 GHz and which is not limited by the RC product of the structure inter alia due to its production procedure, which makes it unnecessary to use a selective epitaxy stage which leads to a deterioration of said factor, and the use of a blocking layer having a composition different from that of the vertical and horizontal confinement layers.

We claim:

1. An optoelectronic device comprising:
    an n-doped, semiconductor material substrate layer (46);
    on said substrate layer (46), a lateral confinement layer (50) of a semiconductor material doped so as to make it semi-insulating;
    a stripe (30) including an active material (32), said stripe (30) being buried in the lateral confinement layer (50) and in contact with the substrate layer (46), the lateral confinement layer (50) having a groove (52) hollowed out above and along the stripe (30);
    an n-doped, semiconductor material blocking layer (70) deposited on each side of the groove (52) on the lateral confinement layer (50);
    an p-doped, semiconductor material, vertical confinement layer (60) deposited on the layer (70) and filling the groove (52) of the lateral confinement layers (50), the layer (70) being made from a material having a different composition from that of the lateral confinement layer and that of the vertical confinement layer;
    a first electrical contact (80, 90) on the vertical confinement layer at least vertically of the stripe (30); and
    a second electrical contact (44) on the substrate layer (46).

2. The optoelectronic device according to claim 1, characterized in that the vertical confinement layer (60) is V-shaped vertically of the stripe (30) including the active material, the first electrical contact (80, 90) adopting said shape.

3. The optoelectronic device according to claim 1 or 2, characterized in that the substrate layer (46), lateral confinement layer (50) and vertical confinement layer (60) are made from a first semiconductor material chosen from within category III-V, the stripe (30), being constituted by components belonging to category III-V, the layer (70) being of a second semiconductor material having a composition different from that of the first material chosen in category III-V.

4. The device according to claim 1 or 2 characterized in that the layer (70) is a quaternary semiconductor material.

5. The device according to claim 1 or 2, characterized in that the stripe has a protection layer (34) on the active material.

6. The device according to claim 1 or 2, characterized in that the substrate layer (46), the lateral confinement layer (50) and the vertical confinement layer (60) are of InP, the active material (32) of the stripe (30) is of GaInAsP, GaInAs or GaAlAs and the layer (70) is of GaInAsP.

7. A process for the production of an optoelectronic device comprising the following steps:
    a) producing a stripe (30) on an n-doped, semiconductor substrate layer (46), including at least one active material layer (32) and an upper etching stopping layer (38),
    b) depositing a lateral confinement layer (50) of a semiconductor material doped in such a way as to make said material semi-insulating on the substrate layer and covering the stripe (30),
    c) producing on the lateral confinement layer (50) an etching mask made from an n-doped semiconductor material having a composition different from that of the lateral confinement layer, which constitutes a layer (70) and has an opening (72) vertically of the stripe (30), d) etching a groove (52) in the lateral confinement layer (50) vertically of the stripe (30) using the etching mask, the depth of the groove being limited by the etching stopping layer (38), e) depositing on the layer (70) a vertical confinement layer (60), made from an p-doped semiconductor material and having a composition different from that of the layer (70), said vertical confinement layer (60) filling the groove (52) and f) producing first (80, 90) and second (44) electrical contacts, respectively, on the vertical confinement layer (60) and the substrate layer (46).

8. The process according to claim 7, characterized in that the etching stopping layer (38) is eliminated between stages d) and e).

9. The process according to claim 7 or 8, characterized in that the deposition of the vertical confinement layer (60) takes place by vapor phase epitaxy.

* * * * *